United States Patent [19]

Tanimoto et al.

[11] Patent Number: 5,430,750
[45] Date of Patent: Jul. 4, 1995

[54] METHOD AND DEVICE FOR SEMICONDUCTOR LASER WITH CONTROLLED THICKNESS OF PROTECTIVE AND OPTICAL FILMS

[75] Inventors: Yasunori Tanimoto; Makoto Futatsugi, both of Kanagawa, Japan

[73] Assignee: Sony Corporation, Tokyo, Japan

[21] Appl. No.: 127,525

[22] Filed: Sep. 28, 1993

[30] Foreign Application Priority Data

Sep. 28, 1992 [JP] Japan .................. 4-258613

[51] Int. Cl.⁶ .......................................... H01S 3/025
[52] U.S. Cl. .............................. 372/49; 372/43
[58] Field of Search ............................ 372/43–50

[56] References Cited

U.S. PATENT DOCUMENTS

| | | | |
|---|---|---|---|
| 4,337,443 | 6/1982 | Umeda et al. | 372/49 |
| 4,751,710 | 6/1988 | Yamaguchi et al. | 372/50 |
| 4,852,112 | 7/1989 | Kagawa et al. | 372/49 |
| 5,056,099 | 10/1991 | Bradley | 372/49 |
| 5,144,635 | 9/1992 | Suhara | 372/49 |
| 5,173,914 | 12/1992 | Kokubo | 372/49 |
| 5,208,468 | 5/1993 | Kawanishi et al. | 372/49 X |

FOREIGN PATENT DOCUMENTS 59-119890  7/1984  Japan ............................... 372/49

*Primary Examiner*—John D. Lee
*Attorney, Agent, or Firm*—Hill, Steadman & Simpson

[57] ABSTRACT

An object is to provide a semiconductor laser device having a continuous distribution in reflection and transmission at the end surface thereof, and a method therefor. In the semiconductor laser device having at the end surface thereof an end surface protection film for preventing oxidation of the end surface and an optical thin film for controlling reflectance, the end surface protection film has continuously-varying film thickness and the optical thin film has constant film thickness. By designing the end surface in a mirror-surface form and varying reflectance, characteristics such as high output, low power consumption, etc. can be improved.

10 Claims, 8 Drawing Sheets

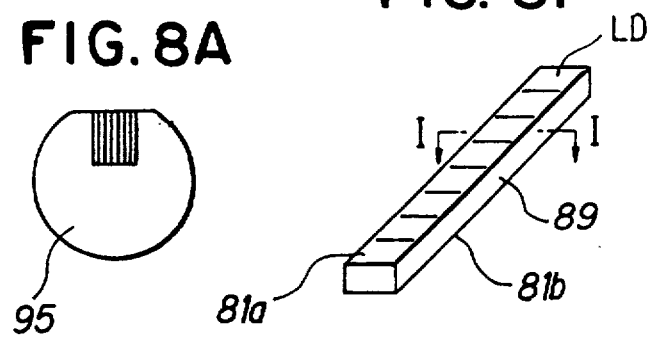
FIG. 8A
FIG. 8F
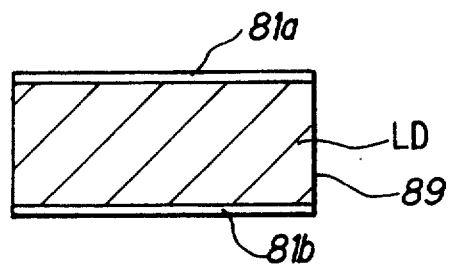
FIG. 8B
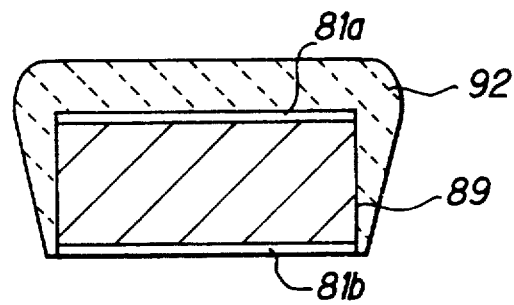
FIG. 8C
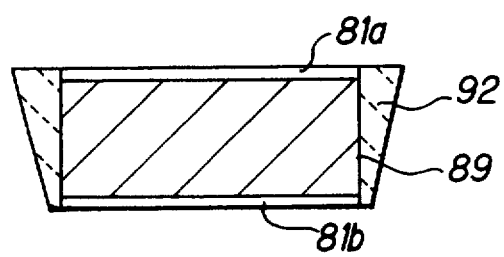
FIG. 8D
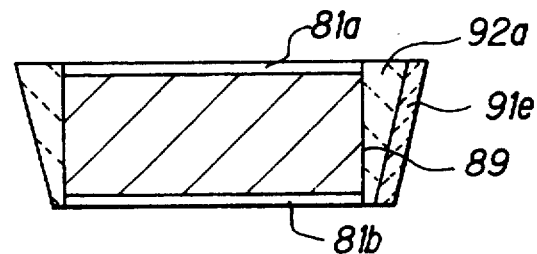
FIG. 8E

METHOD AND DEVICE FOR SEMICONDUCTOR LASER WITH CONTROLLED THICKNESS OF PROTECTIVE AND OPTICAL FILMS

BACKGROUND OF THE INVENTION

1. Field of the Invention

This invention relates to a semiconductor laser device and a manufacturing method therefor, and particularly to the control of reflectance of an end surface of a semiconductor laser device.

2. Description of the Related Art

Ordinarily, a semiconductor laser which is indispensable as a light source for an optical communication, an optical information processing and an optical measurement has a double hetero-structure in which an active layer (light emission layer) is sandwiched between an n-clad layer and p-clad layer at both sides thereof.

FIG. 1 is a perspective view of a semiconductor laser device. As shown in FIG. 1, when a forward voltage is applied to an active layer 4 composed of a semiconductor having small band gap, and an n-clad layer 3 and a p-clad layer 5 which are composed of semiconductor having large band gap, electrons and holes flow into the active layer 4 from the n-clad layer 4 and the p-clad layer 5, respectively. These carriers are trapped in the active layer 4 by an energy barrier due to a band gap difference at the heterojunction. This trapping of the carriers promotes effective recombination between the electrons and the holes, and produces spontaneously-emitting light. The spontaneous emission light further promotes subsequent recombination between the electrons and the holes. On the other hand, the end surface of the active layer 4 serves as a reflection mirror for an optical resonator, so that induced emission and light amplification are promoted while the light goes and returns in the optical resonator. In this case, by increasing injection current amount to some degree, laser oscillation is finally induced, and the output intensity of the light is rapidly increased. As a result, a laser beam having directivity and narrow spectral band width is emitted from an emission point 8.

An n-electrode 1 and a p-electrode 7 are used to control the injection current, and a cap layer 6 is used to reduce resistance for the p-electrode 7.

Semiconductor containing Al such as AlGaAs group, AlInP group or the like has been frequently used for the n-clad layer 3, the active layer 4 and the p-clad layer 5 of the semiconductor laser. Therefore, as shown in FIG. 1B, an end surface protection film 10 is grown to prevent oxidation of Al.

On the other hand, the end surface 9 serves as a reflection mirror for laser oscillation, and an improvement in characters such as high output, low power consumption, etc. is realized by growing an optical thin film on the end surface protection film 10 and varying reflectance efficiency of the mirror surface (hereinafter referred to as "end surface reflectance").

However, when a semiconductor laser device is installed into an optical system, light beam emitted from the semiconductor laser device returns back from the optical system, and thus noises occur. Therefore, the following method has been conventionally adopted to prevent the affection of the return beam.

FIG. 2 is a diagram showing an optical thin film forming method of a first related art. After an optical thin film 22 is formed on the end surface protection film 20 of the semiconductor laser device, using a photolithography, a laser beam or the like is irradiated from a light source 23 to a portion adjacent to an emission point 21 as shown in FIG. 2A to form an optical thin film 22a and vary its thickness, whereby the optical thin film 22a having high reflectance is formed in the neighborhood of the emission point 21 and an optical thin film 22b having low reflectance is formed at the other regions.

FIG. 3 is a diagram showing an optical thin film forming method of a second related art. As shown in FIG. 3A or 3B, a partition plate 50 is disposed in front of an end surface protection film 40 of the semiconductor laser device, and metal which is supplied from a deposition source is shielded by this partition plate 50 to vary the thickness of optical thin films 41a and 41b and the thickness of optical thin films 41c and 41d, respectively, whereby the optical thin films 41a and 41c having high reflectance are formed at the emission point 38 and the optical thin films 41b and 41d having low reflectance are formed at the other regions. FIG. 3C is another view of FIG. 3A which is viewed from a deposition source direction.

FIG. 4 is a diagram showing an optical thin film forming method of a third related art. As shown in FIG. 4, the thickness t of the semiconductor laser device is reduced and an optical thin film 62 having high reflectance is formed over the end surface.

In the first related art as shown in FIG. 2, the optical thin films 22a and 22b having different reflectance are formed by irradiation of a laser beam or the like, however, this method has a problem in the point that a device for irradiating the laser beam or the like and its control operation are complicated. Further, in the second related art as shown in FIG. 3, the optical thin films 41a and 41b and the optical thin films 41c and 41d which have different reflectance are formed using the partition plate 40, however, this method also has a problem in the point that a device for controlling the partition plate 40 is complicated. Still further, in the third related art as shown in FIG. 4, a yield is reduced due to cracking occurring in a process where a semiconductor laser device is thinned in a wafer state. In addition, in any methods as shown in FIGS. 2 to 4, restriction is imposed on a distribution of reflectance, and thus the improvement in characters of the semiconductor laser device is limited.

OBJECT AND SUMMARY OF THE INVENTION

An object of this invention is to provide a semiconductor laser device having a continuous distribution of reflection and transmission at the end surface thereof and a manufacturing method therefor.

In order to solve the above problem, according to this invention, a semiconductor laser device in which an end surface protection film for preventing oxidation of the end surface of the semiconductor laser device and an optical thin film for controlling reflectance are provided at the end surface thereof, is characterized in that the end surface protection film has continuously-varying film thickness, and the optical thin film has constant film thickness.

Further, in order to solve the above problem, according to this invention, a semiconductor laser device in which an end surface protection film for preventing oxidation of the end surface of the semiconductor laser device and an optical thin film for controlling reflectance are provided at the end surface thereof, is characterized in that the end surface protection film has constant film thickness and the optical thin film has continuously-varying film thickness.

Still further, in order to solve the above problem, according to this invention, a semiconductor laser device in which an end surface protection film for preventing oxidation of the end surface of the semiconductor laser device and an optical thin film for controlling reflectance are provided at the end surface thereof, is characterized in that the end surface protection film has continuously-varying film thickness and the optical thin film has continuously-varying film thickness.

Still further, in order to solve the above problem, according to this invention, a method for manufacturing a semiconductor laser device equipped with first and second electrodes which are arranged in confrontation to each other to control light emission, and equipped at the end surface thereof with an end surface protection film for preventing oxidation of the end surface or an optical thin film for controlling reflectance, is characterized by comprising the steps of forming an insulating film as material film of the end surface protection film or the optical thin film on the whole surface of at least one of the first and second electrodes, and subjecting the whole surface of the insulating film to etchback to form the end surface protection film or the optical thin film with side wall.

Still further, in order to solve the above problem, according to this invention, a semiconductor laser device equipped at the end surface thereof with any one of an end surface protection film for preventing oxidation of the end surface of the semiconductor laser device and an optical thin film for controlling reflectance, is characterized in that the end surface protection film or the optical thin film has continuously-varying film thickness.

Still further, in order to solve the above problem, according to this invention, a method for manufacturing a semiconductor laser device in which an end surface protection film for preventing oxidation of an end surface of the semiconductor laser device or an optical thin film for controlling reflectance is formed on the end surface by deposition, is characterized in that a surface under deposition is inclined at a predetermined angle to vary a distance between a deposition source and the surface under deposition, thereby forming the end surface protection film or optical thin film which has continuously-varying film thickness.

BRIEF DESCRIPTION OF THE DRAWINGS

FIGS. 8(A) to 8(F) are a process chart for forming the semiconductor laser device of this embodiment according to this invention.

DETAILED DESCRIPTION OF THE PREFERRED EMBODIMENTS

Preferred embodiments according to this invention will be described in detail with reference to the accompanying drawings.

Figure 1A:
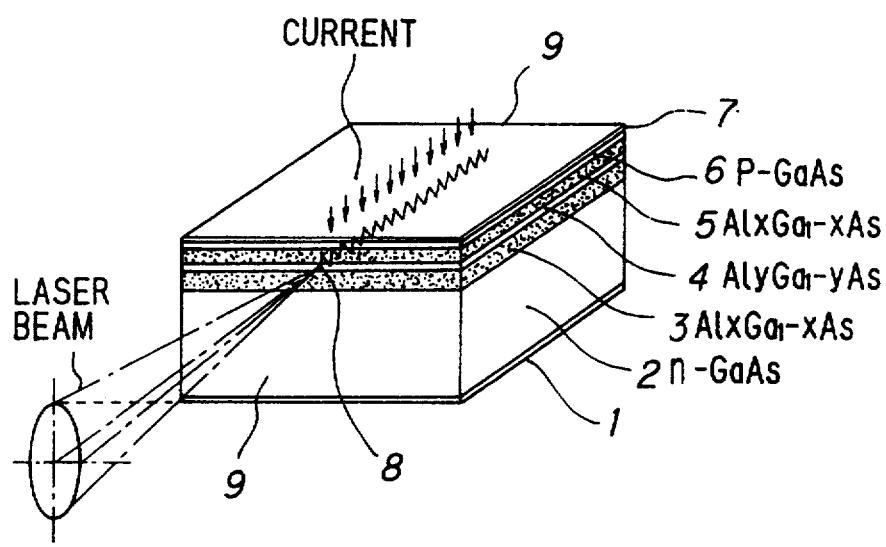
FIGS. 1(A) and 1(B) are a perspective view of a semiconductor laser device of a related art.
Figure 1B:
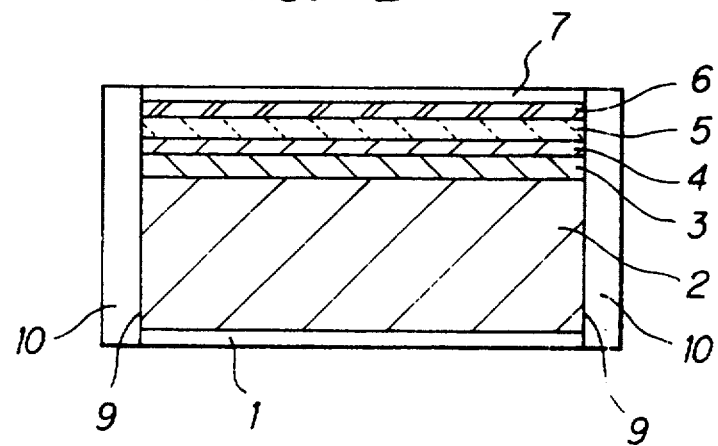
Figure 2A:
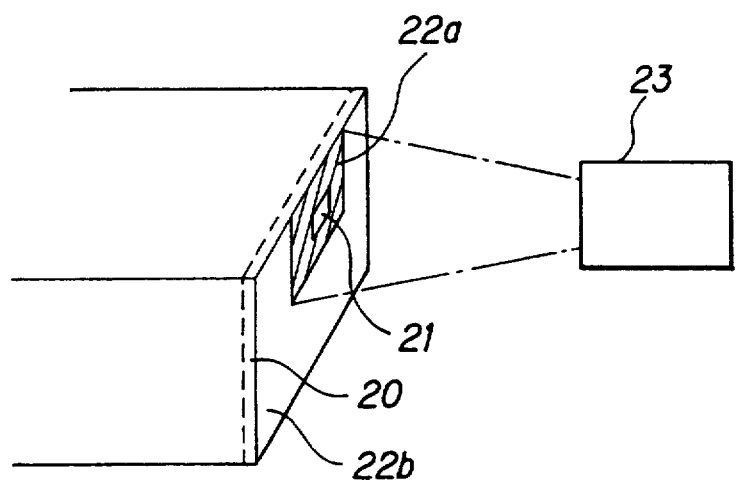
FIGS. 2(A) and 2(B) are a diagram showing an optical thin film forming method (I) of a related art.
Figure 2B:
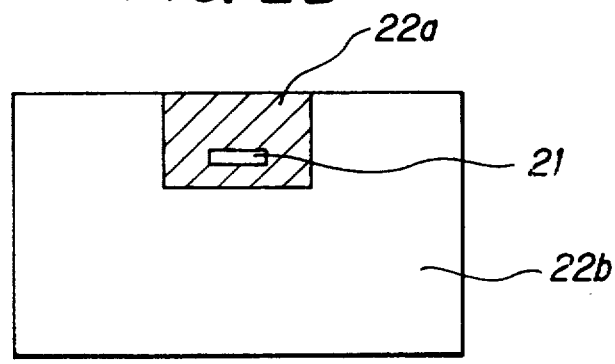
Figure 3A:
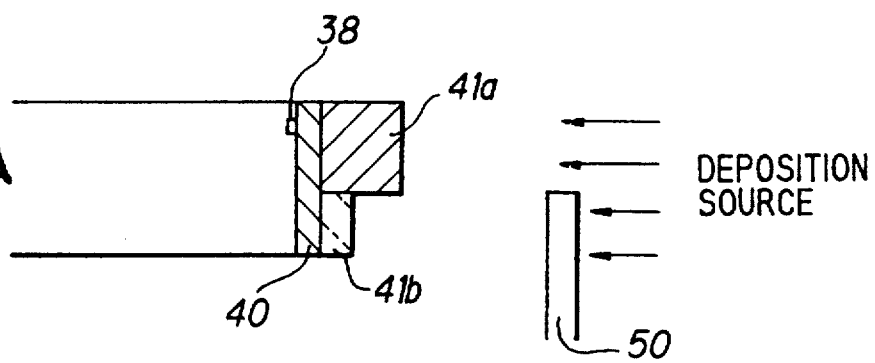
FIGS. 3(A) to 3(C) are a diagram showing an optical thin film forming method (II) of a related art.
Figure 3B:
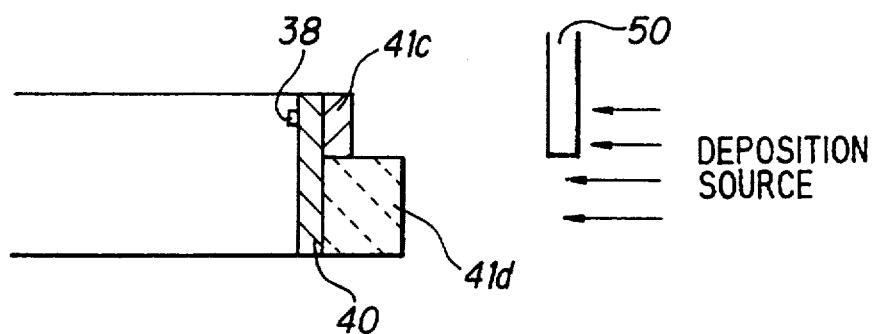
Figure 3C:
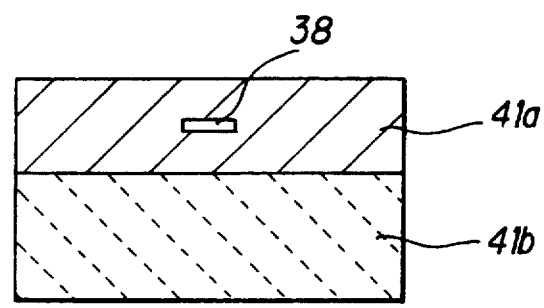
Figure 4:
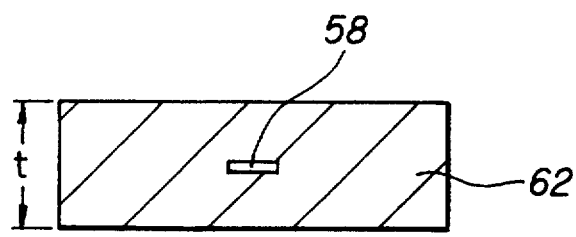
FIG. 4 is a diagram showing an optical thin film forming method (III) of a related art.
Figure 5A:
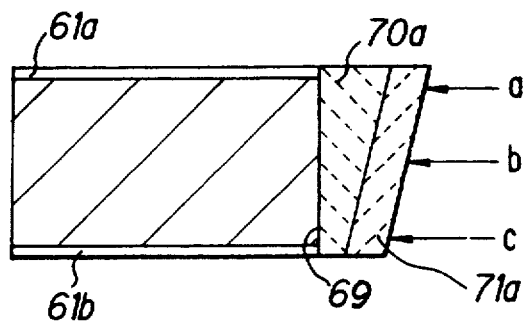
FIGS. 5(A) to 5(E) are a cross-sectional view (I) of a semiconductor laser device of this embodiment according to this invention.

FIG. 5A is a cross-sectional view of a semiconductor laser device of a first embodiment of this invention. As shown in FIG. 5a, an end surface protection film (SiN) 70a having variable film thickness and an optical thin film ($Al_2O_3$) 71a having constant film thickness are formed on the end surface of the semiconductor laser device. It will be hereunder described that with such a structure, the end surface reflectance is variable between an emission point a and the other regions.

Figure 7:
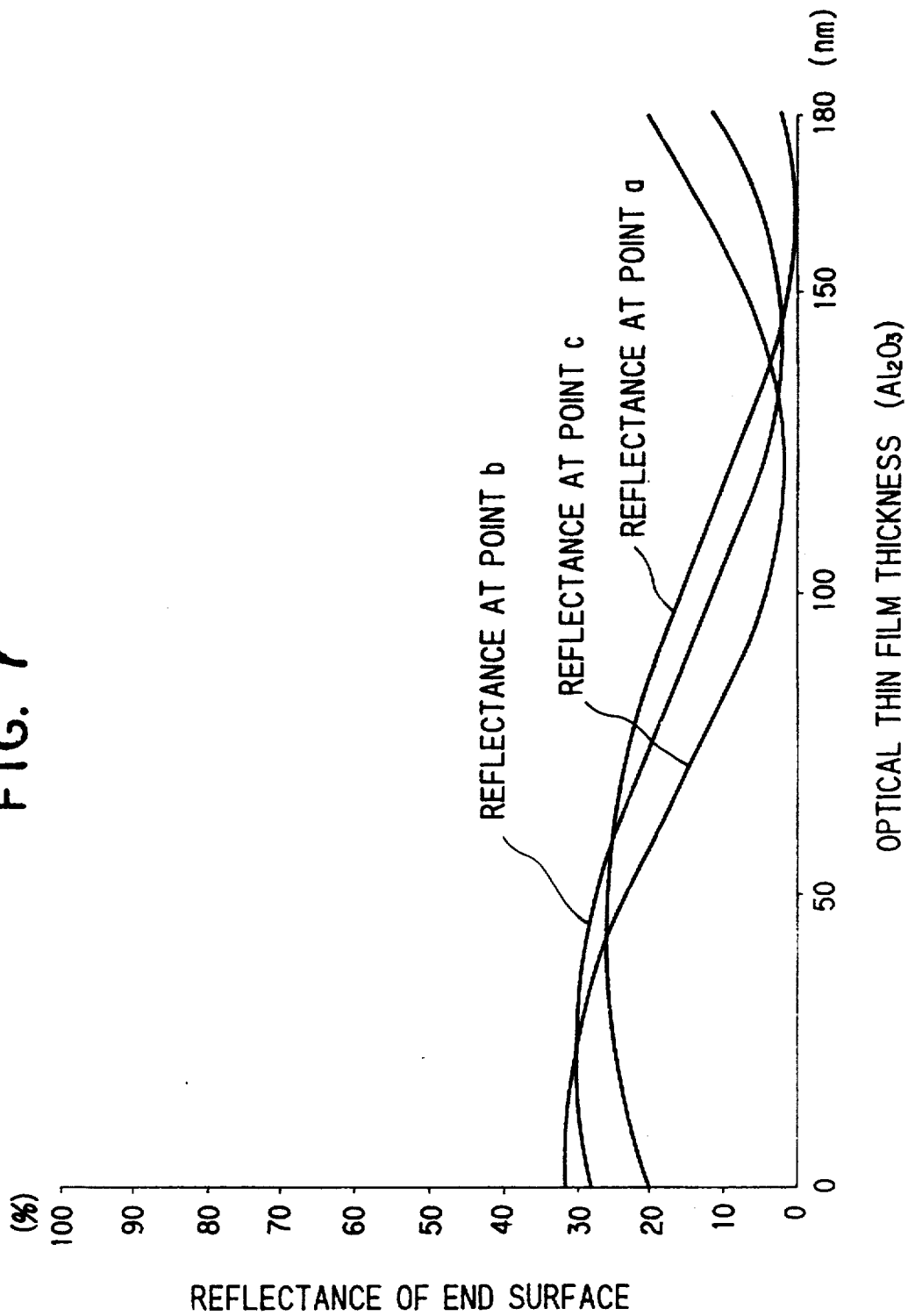
FIG. 7 is a graph showing an end surface reflectance distribution of the semiconductor laser device as shown in FIGS. 4 and 5.

FIG. 7 is a graph showing that the end surface reflectance of light of 785 nm wavelength is varied by varying the thickness of the optical thin film ($Al_2O_3$). The thickness of the end surface protection film (SiN) 70a is set to 190 nm, 170 nm and 150 nm at positions a, b and c as shown in FIG. 5a, respectively, and the thickness of the optical thin film is varied on the end surface protection film (SiN) 70a. In case of provision of only the end surface protection film (SiN) 70a, the end surface reflectance is 32%, 28% and 20% at the positions a, b and c, respectively. Here, setting the thickness of the optical thin film ($Al_2O_3$) 71a to 80 nm, as shown in FIG. 7, the end surface reflectance is 12%, 18% and 22% at the positions a, b and c, respectively.

Further, setting the thickness of the optical thin film ($Al_2O_3$) 71a to 160 nm, the end surface reflectance is 12%, 4% and 0.5% at the positions a, b and c, respectively. As described above, the end surface reflectance can be varied using the structure as described above.

Figure 5B:
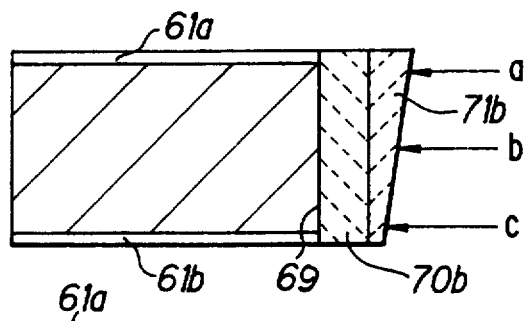

Next, FIG. 5B is a cross-sectional view of a semiconductor laser device of a second embodiment of this invention. As shown in FIG. 5B, on an end surface 69 of the semiconductor laser device are formed an end surface protection film (SiN) 70b having constant film thickness, and an optical thin film ($Al_2O_3$) 71b having variable film thickness. It will be hereunder described that with such a structure the end surface reflectance can be varied between the emission point a and the other regions.

Setting the thickness of the end surface protection film (SiN) 70b to 170 nm, the end surface reflectance is located on the reflectance curve at the b point as shown in FIG. 7 by the optical thin film ($Al_2O_3$) 71b. Accordingly, by varying the thickness of the optical thin film ($Al_2O_3$) 71b, the end surface reflectance can be varied. For example, assuming that the film thickness at the point a is 70 nm, the film thickness at the point c is 80 nm and the film thickness at the point c is 100 nm, the end surface reflectance is 22%, 18% and 12% for the points a, b and c, respectively. As described above, the end surface reflectance can be continuously varied using the structure as described above.

Figure 5C:
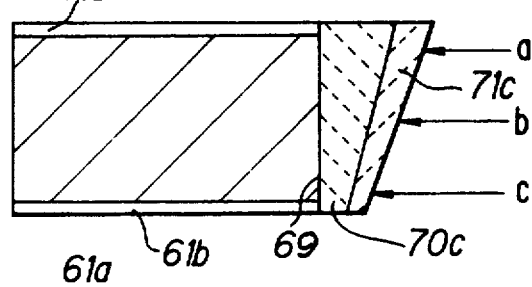

Next, FIG. 5C is a cross-sectional view of a semiconductor laser device of a third embodiment according to this invention. On the end surface 69 of the semiconductor laser device are formed an end surface protection film ($Al_2O_3$) 70c having variable film thickness, and an optical thin film ($Al_2O_3$) 71c having variable film thickness. It will be hereunder described that with such a structure the end surface reflectance can be varied between the emission point a and the other regions.

Upon setting the thickness of the end surface protection film (SiN) 70c to 190 nm, 170 nm and 150 nm at the positions a, b and c respectively and forming an optical thin film ($Al_2O_3$) 11c on the end surface protection film, the end surface reflectances thereof are located on the reflectance curve at the point a, the reflectance curve at the point b and the reflectance curve at the point c respectively as shown in FIG. 7. Therefore, by varying the film thickness of the optical thin film ($Al_2O_3$), the end surface reflectance can be continuously varied.

Figure 5D:
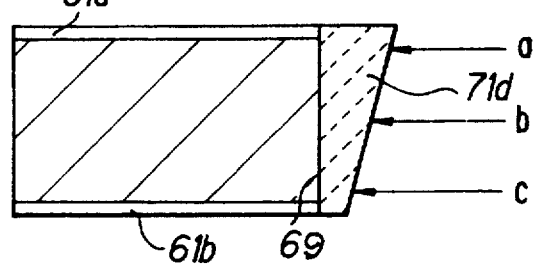

Next, FIG. 5D is a cross-sectional view of a semiconductor laser device of a fourth embodiment according to this invention, and on the end surface 69 is formed an optical thin film ($Al_2O_3$) 71d having variable film thickness. This structure corresponds to a special case where the thickness of the end surface protection film is set to "0" in the second embodiment having the thickness-variable optical thin film ($Al_2O_3$)⁻ formed on the thickness-constant end surface protection film, and thus the end surface reflectance can be continuously varied.

Figure 5E:
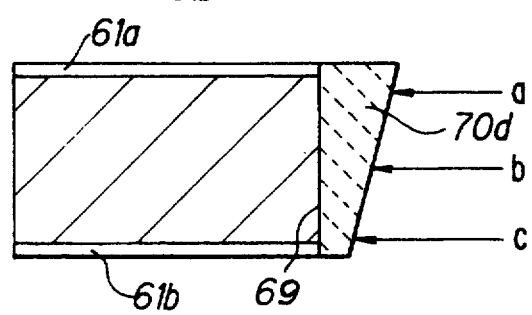
Figure 6A:
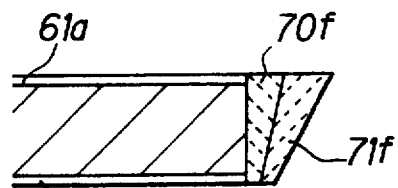
FIGS. 6(A) to 6(H) are a cross-sectional view (II) of the semiconductor laser device of this embodiment according to this invention.
Figure 6B:
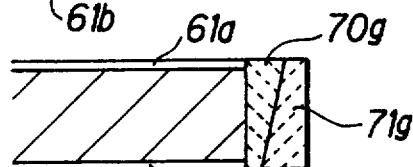
Figure 6C:
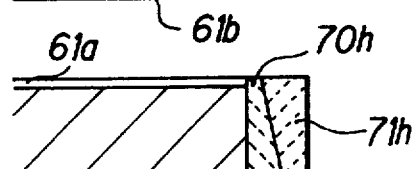
Figure 6D:
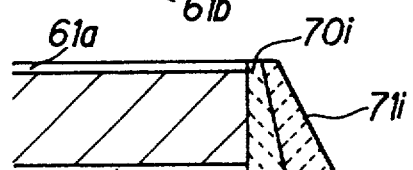
Figure 6E:
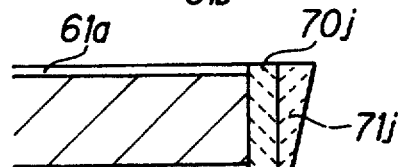
Figure 6F:
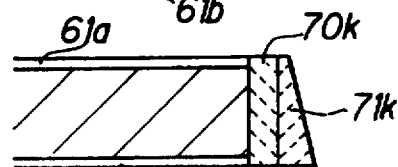
Figure 6G:
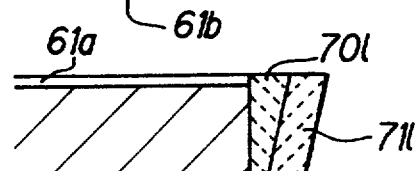
Figure 6H:
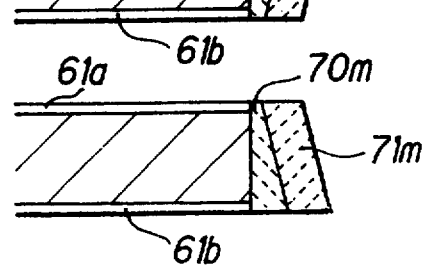

Next, FIG. 5E is a cross-sectional view of a semiconductor laser device of a fifth embodiment according to this invention, and on the end surface 69 is formed only an end surface protection film (SiN) 70d having variable film thickness. This structure corresponds to a special case where the thickness of the optical thin film of FIG. 5A is set to "0", and thus the end surface reflectance can be continuously varied.

FIG. 6 shows fine classifications based on variation of the film thickness of the end surface protection film and the optical thin film as shown in FIG. 5. FIG. 6A shows a case where both of an end surface protection film 70f and an optical thin film 71f at the electrode 61a side are thicker than at the electrode 61b side, FIG. 6B shows a case where an end surface protection film 70g is thicker and an optical thin film 71g is thinner. FIG. 6C shows a case where an end surface protection film 70h is thinner and an optical thin film 71h is thicker. FIG. 6D shows a case where both of an end surface protection film 70i and an optical thin film 71i are thinner. FIG. 6E shows a case where an end surface protection film 70j is equal and an optical thin film 71j is thicker. FIG. 6F shows a case where an end surface protection film 70k is equal and an optical thin film 71k is thinner. FIG. 6G shows a case where an end surface protection film 70l is thicker and an optical thin film 71l is equal, and FIG. 6H shows a case where an end surface protection film 70m is thinner and an optical thin film 71m is equal. As described above, by variously varying the film thickness, the end surface reflectance can be continuously varied with high precision.

A method of manufacturing the semiconductor laser device according to a sixth embodiment of this invention.

FIG. 8A is a plane view showing a cleaved state of a wafer 95, and a partially-enlarged perspective view of the plane view, and FIG. 8B is a cross-sectional view of the perspective view which is taken along I—I direction. FIGS. 8C to 8E are cross-sectional views of a process for forming the end surface protection film and the optical thin film.

In this embodiment, as shown in FIG. 8A, the wafer 95 is first cleaved in a strip form on a crystal plane to obtain the wafer as shown in the cross-sectional view of FIG. 8B. Next, as shown in FIG. 8C, an SiN film 92 is formed in thickness of about 200 nm at an electrode 81a side by a plasma CVD (chemical vapor deposition) method. Subsequently, the whole surface of the electrode 81a is subjected to the etchback by RIE (reactive ion etching) to form an end surface protection film (SiN) 92a as shown in FIG. 8D. In this case, the film thickness and end surface reflectance are 190 nm and 32% at the emission point a, 170 and 28% at the center of the end surface b, and 150 nm and 20% at the point C which is symmetrical with the point a, respectively.

Subsequently, an optical thin film ($Al_2O_3$) 91e is formed with $Al_2O_3$ serving as a deposition source by a sputtering method. At this time, the film thickness of the optical thin film ($Al_2O_3$) 91e can be continuously varied because the distance between the deposition source and each region on the end surface protection film (SiN) 92a is varied by inclination of the surface of the end surface protection film (SiN) 92a. Setting the thickness of the optical thin film ($Al_2O_3$) 91e to 80 nm, the end surface reflectance at the points a, b and c is 12%, 18% and 22%, respectively.

Further, the thickness of the end surface protection film (SiN) 92a can be continuously varied to a desired thickness by varying the film thickness on the electrode 81a or by forming an SiN film from the electrode 81b side again.

Therefore, the film thickness of the end surface protection film (SiN) 92a and the optical thin film ($Al_2O_3$) 91e can be continuously varied, and the end surface reflectance can be continuously varied by a combination of the film thickness of these films.

Further, a-Si may be used for the optical thin film, and the optical thin film may be a multilayered film. The optical thin film and the end surface protection film may be formed in this order on the end surface. Further, the optical thin film may be formed by the etchback and the end surface protection film may be formed by the sputtering method.

As described above, according to this invention, the reflectance can be easily controlled by variation in film thickness of the end surface protection film and variation in film thickness of the optical thin film, and noise occurrence due to the return of the emitted light of the semiconductor laser from the optical system can be prevented, so that measurement yield can be improved. Further, the noise occurrence can be suppressed by the semiconductor laser itself, so that the optical system can be simplified and the cost can be reduced.

What is claimed is:

1. A semiconductor laser device having at the end surface thereof an end surface protection film for preventing oxidation of the end surface and an optical thin film for controlling reflectance, being characterized in that said end surface protection film has constant film thickness and said optical thin film has continuously-varying film thickness.

2. A semiconductor laser device according to claim 1, wherein said optical thin film surface varies linearly from a thicker portion at the emission end of the optical thin film to a thinner portion at the opposite end of said optical thin film.

3. A semiconductor laser device according to claim 1, wherein the thickness of said protection film is zero.

4. A semiconductor laser device according to claim 1, wherein said optical film varies linearly from a thin portion at the emission end of said film to a thick portion at the opposite end of said film.

5. A semiconductor laser device having at the end surface thereof an end surface protection film for preventing oxidation of the end surface and an optical thin film for controlling reflectance, being characterized in that said end surface protection film has continuously-varying film thickness and said optical thin film has continuously-varying film thickness.

6. A semiconductor laser device according to claim 5, wherein said protection film varies linearly from a thicker portion at the emission end of the film to a thinner portion at the opposite end of said film, and said optical film varies linearly from a thicker portion at the emission end of the film to a thinner portion at the opposite end of said film.

7. A semiconductor laser device according to claim 5, wherein said protection film varies linearly from a thick portion at the emission end of said film to a thin portion at the opposite end of said film, and said optical film varies from a thin portion at the emission end of said film to a thick portion at the opposite end of said film.

8. A semiconductor laser device according to claim 5, wherein said protection film varies linearly from a thin portion at the emission end of said film to a thick portion at the opposite end of said film, and said optical film varies from a thick portion at the emission end of said film to a thin portion at the opposite end of said film.

9. A semiconductor laser device according to claim 5, wherein both said protection film and said optical film vary linearly from a thin portion at the emission end of said films to a thick portion at the opposite end of said films.

10. A method for manufacturing a semiconductor laser device equipped with first and second electrodes which are arranged in confrontation to each other to control light emission, and equipped at the end surface thereof and an end surface protection film for preventing oxidation of the end surface or an optical thin film for controlling reflectance, is characterized by comprising the steps of forming an insulating film as material film of the end surface protection film or the optical thin film on the whole surface of at least one of the first and second electrodes, and subjecting the whole surface of the insulating film to etchback to form the end surface protection film or the optical thin film with side wall.

* * * * *